United States Patent [19]
Bland et al.

[11] Patent Number: 5,770,903
[45] Date of Patent: Jun. 23, 1998

[54] REFLUX-COOLED ELECTRO-MECHANICAL DEVICE

[75] Inventors: Timothy J. Bland; Michael G. Schneider, both of Rockford, Ill.

[73] Assignee: Sundstrand Corporation, Rockford, Ill.

[21] Appl. No.: 492,509

[22] Filed: Jun. 20, 1995

[51] Int. Cl.⁶ .............................. H02K 5/18; H02K 5/20; H02K 9/00; H02K 9/19
[52] U.S. Cl. ............................................... 310/64; 310/54
[58] Field of Search .................................. 310/52, 54, 58, 310/59, 64, 65

[56] References Cited

U.S. PATENT DOCUMENTS

| | | | |
|---|---|---|---|
| 2,683,823 | 7/1954 | Cunningham et al. | 310/52 |
| 3,024,298 | 3/1962 | Goltsos et al. | 174/15 |
| 3,710,156 | 1/1973 | Laing | 310/54 |
| 3,906,261 | 9/1975 | Ogura et al. | 310/54 |
| 4,057,104 | 11/1977 | Altoz | 165/35 |
| 4,295,067 | 10/1981 | Binder et al. | 310/64 |
| 4,398,108 | 8/1983 | Danilevich et al. | 310/54 |
| 4,501,123 | 2/1985 | Ina | 62/119 |
| 4,562,702 | 1/1986 | Endo et al. | 62/376 |
| 4,602,177 | 7/1986 | Eckels et al. | 310/59 |
| 4,705,102 | 11/1987 | Kanda et al. | 165/104.33 |
| 4,944,344 | 7/1990 | Crowe | 165/104.33 |
| 5,081,382 | 1/1992 | Collings et al. | 310/54 |
| 5,237,227 | 8/1993 | Huss | 310/54 |
| 5,293,089 | 3/1994 | Frister | 310/54 |
| 5,578,879 | 11/1996 | Heidelberg et al. | 310/54 |
| 5,581,135 | 12/1996 | Ito et al. | 310/54 |
| 5,627,420 | 5/1997 | Rinker et al. | 310/54 |

*Primary Examiner*—Clayton E. Laballe
*Attorney, Agent, or Firm*—Lawrence E. Crowe

[57] ABSTRACT

An electro-mechanical device having an integral reflux-type cooler configured to conduct heat generated in a first member of the electro-mechanical device to a heat sink, while not exposing a second member of the device to refrigerant in the reflux cooler is provided. In some embodiments of the invention, the refrigerant is allowed to directly contact electrical windings, or a magnetic core of the electro-magnetic device for maximizing heat transfer. Other embodiments of the invention provide integral phase change material for heat storage capability, and allow flexibility in mounting the condenser of the reflux cooler remotely from the electro-mechanical device.

23 Claims, 10 Drawing Sheets

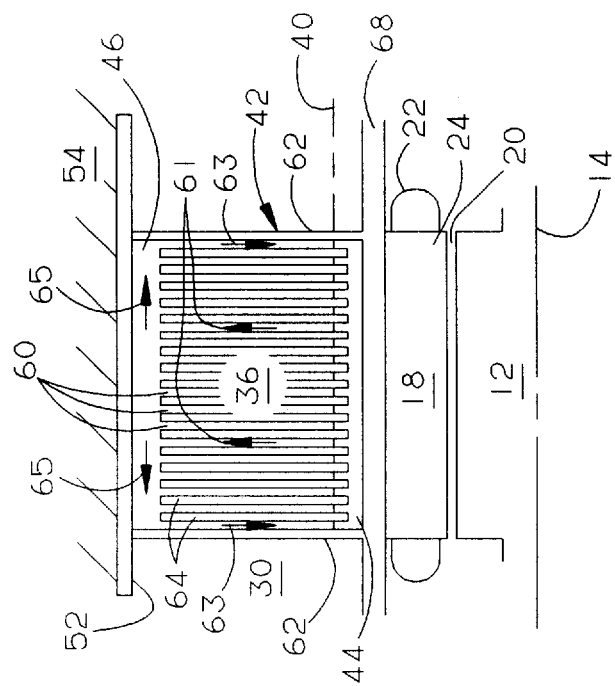
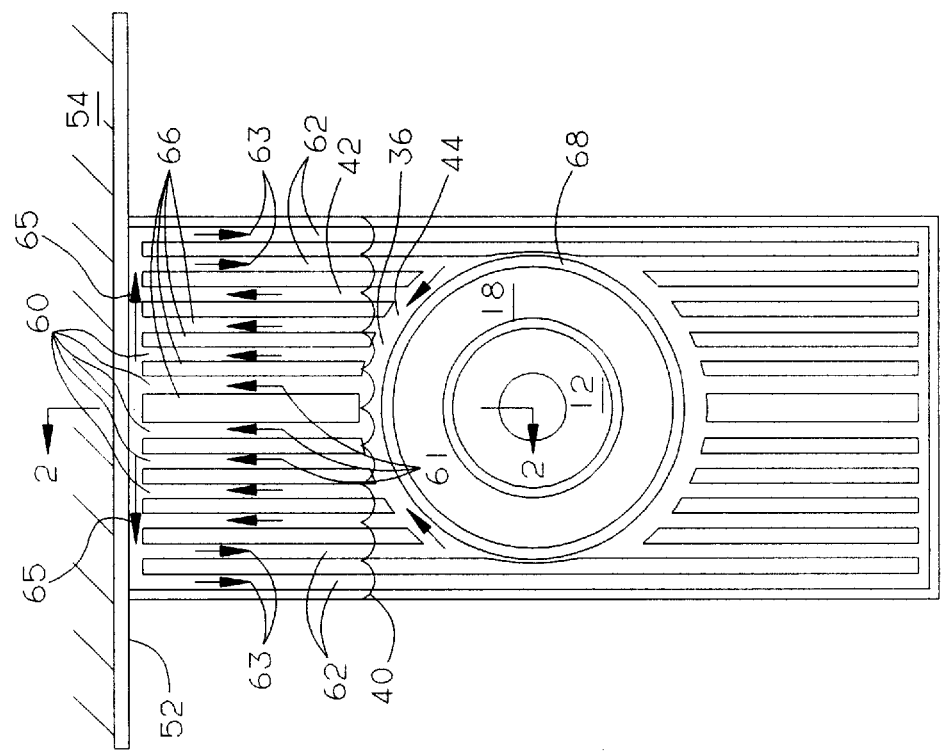
FIG. 2
FIG. 3

REFLUX-COOLED ELECTRO-MECHANICAL DEVICE

TECHNICAL FIELD

This invention relates to electrical devices such as motors, generators, transformers, solenoids, or synchros, etc., having a member requiring cooling, and more particularly to electro-mechanical devices requiring a self-contained cooling system for transferring heat generated within the electro-mechanical device to a heat sink.

BACKGROUND OF THE INVENTION

In modern actuation systems, such as those used to power aircraft control surfaces, there is a trend toward utilizing individual, stand alone, electro-mechanical devices that are capable of producing power without being tied into a centralized hydraulic or electrical circuit. Eliminating the need for routing bulky hydraulic piping from a centralized system to individual electro-mechanical devices located throughout the aircraft, provides an actuation system offering numerous advantages such as: reduced weight and cost; enhanced reliability; less vulnerability to flight critical battle damage in military aircraft; and elimination of the potential for leakage in hydraulic lines.

The advantages listed above will be lost, however, or only partially realized if it is necessary to provide coolant to the individual electro-mechanical devices from a centralized hydraulic circuit, or to provide a complex localized cooling system having pumps, valves, accumulators, etc. for each individual device. What is needed, therefore, is an electro-mechanical device having an integral, self-contained cooling system of simple construction which can maintain the temperature of the electro-mechanical device within acceptable limits.

One prior approach to providing such a cooling system utilizes a cooling jacket filled with a boilable liquid, such as water, disposed about a heat producing device such as an electric motor. As the liquid boils it is vented to the atmosphere through an orifice or a relief valve. As long as sufficient liquid remains in the cooling jacket to totally surround the heat producing device, the liquid will maintain the heat producing device at or below a predetermined temperature which is dependent upon the boiling temperature of the particular fluid selected, the ambient atmospheric pressure, and the size of the orifice or relief valve, together with the heat flux from the motor. This approach has the obvious disadvantage, however, of needing to be regularly recharged with boilable fluid to replace the fluid exhausted to the atmosphere. U.S. Pat. No. 2,683,823 to Cunningham, et al., is illustrative of this approach.

In some types of cold-plates used for cooling electronic components or circuits, the inconvenience of regularly recharging the cooling system is overcome through the use of so called thermosyphon or reflux coolers. In such coolers, a refrigerant is hermetically sealed in a boiling fluid chamber which is in thermal communication with the source of heat and a condenser. The fluid chamber is only partially filled with refrigerant, with the precise amount of refrigerant being carefully selected to provide both a vapor constituent and a liquid constituent of the refrigerant within the fluid chamber at a desired operating temperature of the heat source.

In operation, heat generated by the heat source is transferred to the liquid constituent of the refrigerant causing it to boil and form vapor bubbles which rise, due to gravitational forces, to a vapor space above the liquid. The condenser, which is disposed above and connected in fluid communication with the vapor space, transfers heat from the refrigerant vapor to a heat sink, thereby causing the refrigerant to condense back to its liquid state. The condensed liquid is then returned to the boiling chamber via a conduit or other means commonly referred to as a "downcomer", to thereby complete the fluid flow cycle.

Some prior reflux-type coolers have also utilized a phase change material (PCM), such as a wax, or a metal having a low melting point, to provide a heat storage function within the cooler. The PCM is typically contained in chambers within the reflux cooler that are thermally connected to the refrigerant, but sealed to prevent the refrigerant and the PCM from physically mixing. The PCM is utilized during short duration transient heating conditions which exceed the normal heat rejection capacity of the reflux cooler. Such transient heating conditions can occur, for instance, at peak loading of the electronic device being cooled, or if the refluxing action is temporarily interrupted by inverted operation of the cooler such that the vapor bubbles cannot reach the condenser.

The particular PCM utilized is selected to have a melting point above the normal operating temperature range of the device being cooled, but below a maximum acceptable temperature of the device. During normal operation, therefore, the PCM is in its solid state. During a transient condition exceeding the nominal heat rejection capacity of the cooler, the temperature will rise to the melting point of the PCM, thereby causing the PCM to melt. While the PCM is melting, the temperature of the device being cooled will be held approximately constant due to latent heat absorption by the PCM. By simply providing a sufficient mass within the cooler of a PCM having an appropriate melting temperature, the device being cooled can be held within acceptable temperature limits during transient heating conditions. Once the transient condition has passed, the reflux cooler will lower the temperature to a point where the PCM will re-freeze and be ready to absorb excess heat flux during any subsequent transient conditions. Without the transient heat storage capacity provided by the PCM, the cooler would have to be made larger in order to maintain the device being cooled within acceptable temperature limits during transient heat flux conditions or inverted operation.

Reflux coolers of the type described above work well where the heat generating devices can be mounted on an external surface of the reflux cooler that is in thermal communication with the liquid in the boiling chamber, or where the heat generating device can be sealed within the boiling chamber. U.S. Pat. Nos. 4,944,344 to Crowe and 4,057,104 to Altoz are illustrative of electronic cold plates having heat generating components mounted on outer faces of a reflux cooler incorporating a PCM heat storage material. Reflux-type coolers having electrical components such as semiconductors, transformers, or electric motors totally sealed within a refrigerant containing chamber are illustrated by: U.S. Pat. Nos. 4,705,102 to Kanda, et al.; 4,562,702 to Endo, et al.; 4,501,123 to Ina; and 3,024,298 to Goltsos.

While such reflux coolers would appear to be an ideal solution to the problem of providing localized cooling for electro-mechanical devices, such as actuators, they have not previously been generally utilized for such a purpose due to problems encountered in sealing the refrigerant containing chamber against leakage into airgaps, or around movable input/output shafts, etc. which must extend through the wall of the chamber in order to connect the electro-mechanical device to either drive or be driven by a mechanism external to the chamber.

Accordingly, it is an object of our invention to provide an electro-mechanical device having a movable input/output shaft for connection to a mechanism external to the electro-mechanical device, and also having an integral, self-contained cooling system. Further objects of our invention include providing:

1. an electro-mechanical device as above which is virtually maintenance free, and particularly such a device which does not require regular recharging to replace coolant exhausted to the atmosphere during operation of the cooling system;
2. an electro-mechanical device as above, utilizing a sealed reflux-type cooling system;
3. an electro-mechanical device as above, incorporating PCM material for providing heat storage sufficient to allow the device to operate safely on a duty cycle of about 20% of full rated power for 80% of the time, and about 100% of rated power for 20% of the time without the necessity for sizing the reflux cooler to continuously dissipate the entire waste heat flux generated by electrical inefficiencies within the electro-mechanical device while operating at essentially 100% of rated power;
4. an electro-mechanical device as above having a rotating input/output for respectively providing/receiving torque from/to an external mechanism;
5. an electro-mechanical device as above having a linear motion input/output for respectively providing/receiving linearly directed force from/to an external mechanism;
6. an electro-mechanical device as in 2 above and including an element thereof, such as an electrical winding and/or an electro-magnetic core, in direct contact with liquid refrigerant in the reflux cooler for enhanced heat transfer, and also including a movable element thereof having an externally accessible input/output that is movable with respect to an axis, with neither the movable element nor input/output being exposed to the refrigerant, thereby precluding the need for any refrigerant seal about either the movable element or the input/output;
7. an electro-mechanical device as above which is readily adaptable for use as an actuator motor in the flight control system of an aircraft, with heat sinking from the cooling system being provided by the airframe of the aircraft; and
8. an electro-mechanical device as above which can be readily manufactured in a compact, lightweight form at low cost.

SUMMARY

Our invention provides such an electro-mechanical device through the use of an integral reflux-type cooler configured to conduct heat generated in a first member of the electro-mechanical device to a heat sink, while not exposing a second member of the device to refrigerant in the reflux cooler. In certain preferred embodiments of our invention, the refrigerant is allowed to directly contact electrical windings, or a magnetic core of the electro-magnetic device for maximizing heat transfer. Other embodiments of our invention provide integral PCM heat storage capability, and allow flexibility in mounting the condenser of the reflux cooler remotely from the electro-mechanical device.

Our invention provides such an electrical device having a first and a second element separated by an airgap and operably connected by electromagnetic forces extending across the airgap. At least one of the first or second elements includes a heat-producing means. Cooling means, including a refrigerant, are provided and configured to allow direct contact of the refrigerant with the heat-producing means, while not allowing the refrigerant to enter the airgap. In some embodiments of our invention, at least one of the first or second elements is movable with respect to the other.

According to one aspect of our invention, the electrical device is an electro-mechanical device including a stationary member having a heat-producing element, and a movable element disposed adjacent to the stationary element and operably coupled thereto by magnetic force. Cooling means are provided having a refrigerant chamber disposed to allow refrigerant contained therein to directly contact the heat-producing element, but not to directly contact the movable element. In some embodiments according to this aspect of our invention the heat-producing element is an electrical winding, or a magnetic core, with the heat being generated due to electrical inefficiencies in the winding or the core.

According to another aspect of our invention, an electro-mechanical device includes a movable element mounted for motion with respect to an axis and having an axially extending output shaft adapted for attachment to a driven load. A stationary stator element is disposed about the movable element but separated therefrom by an airgap. The stator includes an electrical winding configured to exert an electromagnetic force for urging the movable element to move with respect to the axis when the winding is supplied with an electrical current. A housing is disposed about and supports the stator. The housing allows the output shaft of the movable element to extend outside of the housing for attachment to the driven load. The housing further defines a sealed boiling chamber about the stator for containing a two-phase fluid. A two-phase fluid partially fills the boiling chamber and forms a liquid level defining a vapor space at an upper portion of the boiling chamber for containing a vapor constituent of the two-phase fluid, and a liquid space at a lower portion of the boiling chamber for containing a liquid constituent of the two-phase fluid. A condenser is provided and adapted for attachment in thermal contact with a heat sink. Vapor conducting means are provided for conducting the vapor constituent of the two-phase fluid from the boiling chamber to the condenser, and downcomer means are provided for conducting a condensed constituent of the two-phase fluid from the condenser back to the boiling chamber.

In a preferred embodiment of our invention, the electrical device further includes a phase change material (PCM) disposed in the boiling chamber for providing cooling of the two-phase fluid through latent heat absorption of the phase change material above a pre-determined melting temperature of the phase change material.

In embodiments of our invention subject to inverted operation, or operation in adverse gravitational force environments, the electrical device further includes a second condenser adapted for attachment in thermal contact with a heat sink, the second condenser being disposed below the boiling chamber and connected thereto by a second vapor conducting and downcomer means such that when the electro-mechanical device is operated in other than an upright position the second condenser will receive the vapor constituent of the two-phase fluid from the boiling chamber via the second vapor conducting means and return the condensed fluid constituent of the two-phase fluid to the boiling chamber via the second downcomer means.

In some embodiments of an electro-mechanical device according to our invention, the condenser forms either an upper or a lower surface of the housing and includes heat exchange means extending into the vapor or liquid spaces of the boiling chamber. In other embodiments of our invention, the condenser is mounted remotely from the housing and the vapor conducting and downcomer means are provided by conduits such that the condenser and housing may be mounted to separate portions of a support structure or heat sink. Where necessary, the conduits may be made flexible, thereby allowing the housing and the condenser to articulate with respect to each other.

Other objects, aspects, and advantages of our invention will become readily apparent upon consideration of the following drawings and detailed descriptions of preferred embodiments.

BRIEF DESCRIPTION OF THE DRAWINGS

For all drawing figures included herewith gravitational force acts in a generally downward direction, as specifically illustrated by vector 100 in FIGS. 1 and 4, when the figure is viewed with the reference numbers in their normally upright position. In all figures, like reference numerals indicate like elements or features.

FIG. 2 is a schematic representation of the upper portion of the actuator of FIG. 1;

FIG. 3 is a schematic cross-sectional view of the actuator of FIG. 1 taken along line 3—3 as indicated in FIG. 1;

DESCRIPTION OF PREFERRED EMBODIMENTS

Figure 1:
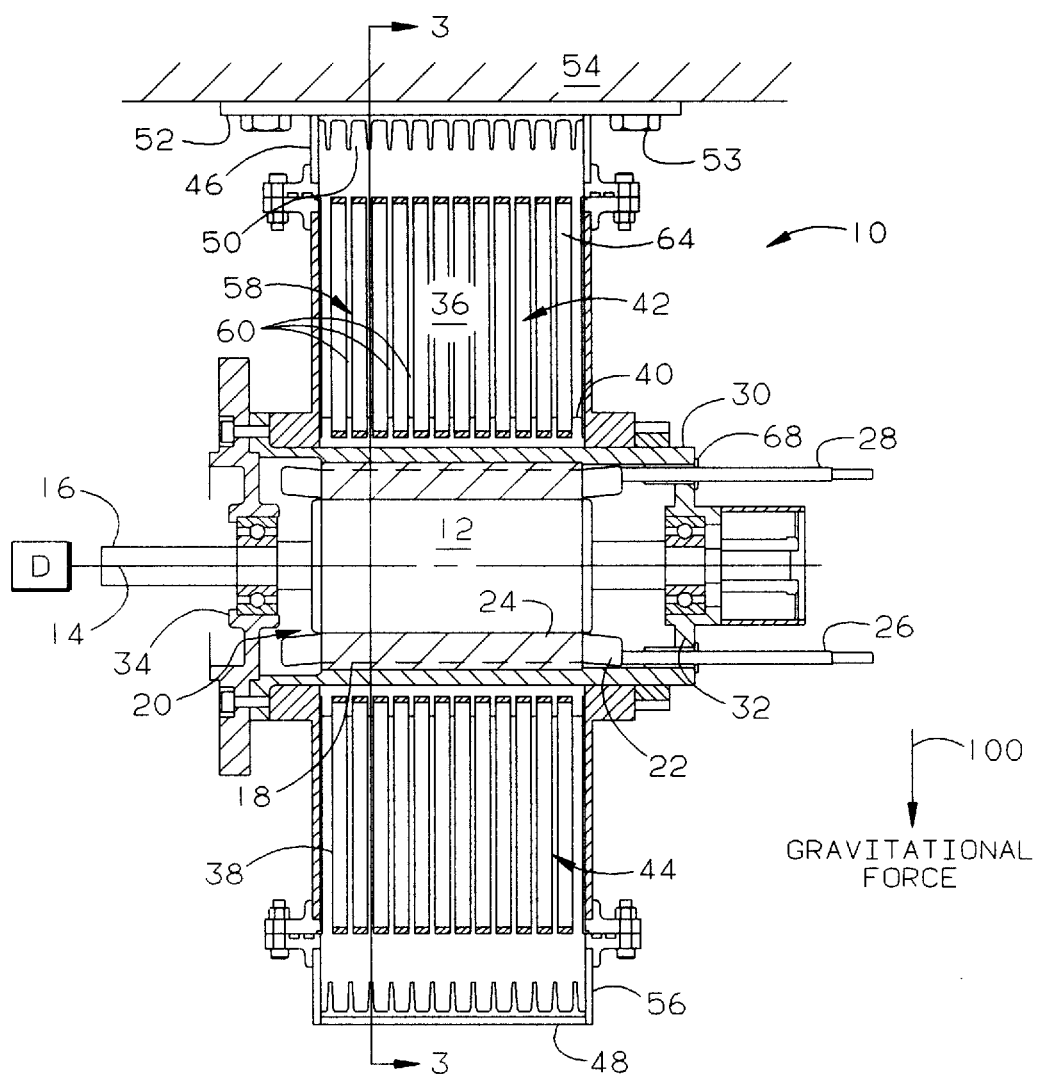
FIG. 1 is a cross-sectional view of an actuator motor having an integral reflux cooler assembly according to our invention.

FIGS. 1 and 2 respectively depicted a pictorial and a schematic view of an exemplary embodiment of an electromechanical actuator 10 according to our invention, of a type which might be used in a flight control surface actuation system of an aircraft. The actuator motor 10 includes a first, movable rotor element 12 mounted for motion with respect to an axis 14 and having an axially extending output shaft 16 adapted for attachment to a driven load D. A second, stationary stator element 18 is disposed about the rotor 10 but separated therefrom by an airgap 20. The term airgap as used herein is contemplated to encompass not only a physical gap having air between two surfaces, but also to encompass a gap having a vacuum, a gas other than air, or any non-electrically conductive solid material therein. The stator 18 includes an electrical winding 22 and a core 24 configured to exert an electromagnetic force across the airgap 20 for urging the rotor 12 to rotate with respect to the axis 14 when the winding 22 is supplied with an electrical current via leads 26 and 28. Electrical inefficiencies in the winding 22 and core 24 produce waste heat, causing the winding 22 and core 24 to function as "heat producing means", for purposes of practicing our invention.

A housing 30 is disposed about and provides support for the stator 18. The housing 30 also provides support for bearings 32,34 in which the rotor 12 is journaled in such a manner that the output shaft 16 may extend outside of the housing 30 for attachment to the driven load D.

The housing 30 further defines a sealed boiling chamber 36 about the stator 18 for containing a two-phase fluid 38, such as a fluorocarbon compound known as FC75® sold under the trade name Fluorinert® by the 3M Company. The boiling chamber 36 is first evacuated to remove any gas therefrom, and then is partially filled with a sufficient amount of the two-phase fluid 38 to form a liquid level 40 at a point slightly above the stator 18, and sealed to define a vapor space 42 at an upper portion of the boiling chamber 36 for containing a vapor constituent of the two-phase fluid 38, and a liquid space 44 at a lower portion of the boiling chamber 36 for containing a liquid constituent of the two-phase fluid 38.

As shown in FIG. 1, the housing 30 has attached thereto respectively at an upper and a lower end thereof a first condenser 46 and a second condenser 48. In the exemplary embodiment depicted in FIG. 1, the first condenser 46 forms the upper surface of the housing 30 and includes heat exchanging fin means 50 extending into the vapor space 42 of the boiling chamber 36. The first condenser 46 further includes a flange 52 adapted for attachment by bolts such as shown at 53 in thermal contact with a heat sink 54. For the actuator 10 of the exemplary embodiment, it is contemplated that such a heat sink would be provided by the airframe of the aircraft, a skin surface capable of transferring heat to air passing over the skin by convection, or a heat exchanger capable of transferring heat received from the first condenser 46 to a fuel circuit of the aircraft.

In similar fashion, the second condenser 48 forms the lower surface of the housing 30 and includes heat exchanging fin means 56 extending into the liquid space of the boiling chamber 36. The second condenser 48 is provided to allow inverted operation of the actuator motor 10 in a manner to be described in more detail below.

Heat exchanger means 58 are disposed within the boiling chamber 36. The heat exchanger 58 includes a structure of thermally conductive material defining vapor conducting means in the form of bubble channels 60 for conducting vapor bubbles of the two-phase fluid in an upward direction, as indicated by arrows 61 in FIG. 2, from the liquid space 44 to the vapor space 42 of the boiling chamber 36. As shown in FIGS. 2 and 3, the heat exchanger 58 further includes downcomer means in the form of downcomer channels 62 for conducting a condensed constituent of the two-phase fluid 38 from either the first or second condensers 46,48 back to the liquid space 44 of the boiling chamber 36, as illustrated by arrows 63. Between the bubble channels 60 the heat exchanger 58 includes sealed chambers 64 filled with a PCM material, such as a wax, a solder, or as in the exemplary embodiment, acetamide. It is contemplated that the heat exchanger 58 be of a type of construction generally known as plate-fin, which will provide excellent heat transfer between the two-phase fluid in the boiling chamber and the PCM material 66 confined in the sealed chambers 64.

When the actuator motor 10 is operated in its normal upright attitude, as depicted in FIG. 1 the reflux cooling means operates as follows: electrical current received by the leads 26,28 is converted by the stator 18 into an electromagnetic torque force acting across the airgap 20 to cause the rotor 12 to rotate about the axis 14 within the bearings 32,34, such that the output shaft 16 extending from the rotor 12 provides a rotary torque input to the driven device D. Heat generated in the electrical winding 22 and the stator core 24, due to electrical inefficiency, is transferred to the two-phase fluid 38 within the boiling chamber 36 via a thermally conductive wall 68 of the housing 30, the wall 68 being interposed between the stator 18 and the boiling chamber 36. The two-phase fluid 38 begins to boil and produce vapor bubbles which travel up the bubble channels 60 as depicted by the upwardly directed arrows 61 in FIG. 3. When the vapor bubbles reach the upper end of the housing 30 they condense and transfer their latent heat to the first condenser through the fins 50 and into the heat sink 54. When the vapor in the vapor space has transferred a sufficient amount of heat to the heat sink 54, it will begin to condense and form a condensed constituent of the two-phase fluid which returns to the boiling chamber 36 via the downcomer channels 62 due to gravitational force. As best seen in FIG. 3, the bubble channels 60 are located radially inward from the downcomer channels 62 such that a natural thermal syphon flow pattern is set up in which the condensed constituent of the two-phase fluid is swept from a central to an outer location within the boiling chamber 36, as shown by arrows 65, and the condensed fluid is returned via the downcomers 62, as shown by arrows 63, to the liquid space 44 of the boiling chamber 36, thereby completing the fluid flow cycle.

As those skilled in the art will readily recognize, for any constant heat flux passing from the stator 18 via the refluxing action of the two-phase fluid 38 to the heat sink 54, the temperature and pressure of the two-phase fluid in the boiling chamber 36 will rise to an equilibrium temperature and remain there so long as both a vapor and a liquid constituent of the two-phase fluid coexist in the boiling chamber 36. For a continuous operation, therefore, the boiling chamber 36, the two-phase fluid, and the condenser 46, which collectively make up the reflux cooler in the normal upright position of the actuator 10, must provide sufficient capacity to transfer a maximum steady state heat flux from the stator 18 to the heat sink 54 while maintaining an equilibrium temperature that results in a maximum winding temperature of the stator 18 which is below an acceptable operating temperature.

Inclusion of the PCM material 66 within the heat exchanger 58, however, allows the actuator motor 10 of the exemplary embodiment of our invention to be operated for short periods of time at heat fluxes which are higher than normal steady-state cooling capacity of the reflux cooler without exceeding the maximum allowable temperature of the electrical winding 22. When such transient, above normal, heat flux conditions are encountered, the temperature of the two-phase fluid 38 will rise above its normal equilibrium value and eventually reach the melting point of the PCM material 66. The PCM material 66 then begins to melt and absorb latent heat in the process of melting, in such a manner that the temperature of the two-phase fluid will be held approximately constant by the melting of the PCM material 66 until it is completely melted. Through judicious selection of the particular type and amount of PCM material used in the cooler, the maximum temperature of the stator 18 may thus be held below the maximum allowable temperature for a limited period of time sufficient for the, above normal, transient heat flux condition to subside. When the heat flux returns to normal operating values, following the transient, the temperature of the two-phase fluid 38 within the boiling chamber will drop below the freezing point of the PCM, due to action of the reflux cooler, and the PCM material 66 will refreeze and be ready to absorb heat during a future transient.

Inclusion of the PCM material 66 thus allows the reflux cooler of the actuator motor 10 to be physically smaller than it would otherwise have to be to absorb continuously the above normal heat flux during the transient period. This aspect of our invention provides significant advantage in actuator motors, such as the exemplary embodiment, which typically operate on a duty cycle of about 20% of full rated power for 80% of the time, and about 100% of rated power for only 20% of the time. Inclusion of the PCM material 66 in such an actuator, therefore allows the reflux cooler to be sized for continuous operation at about 20% of full rated power. The PCM material will absorb heat flux during those periods of time in which the actuator 10 is operated at between 20 and 100% of rated power.

Figure 4:
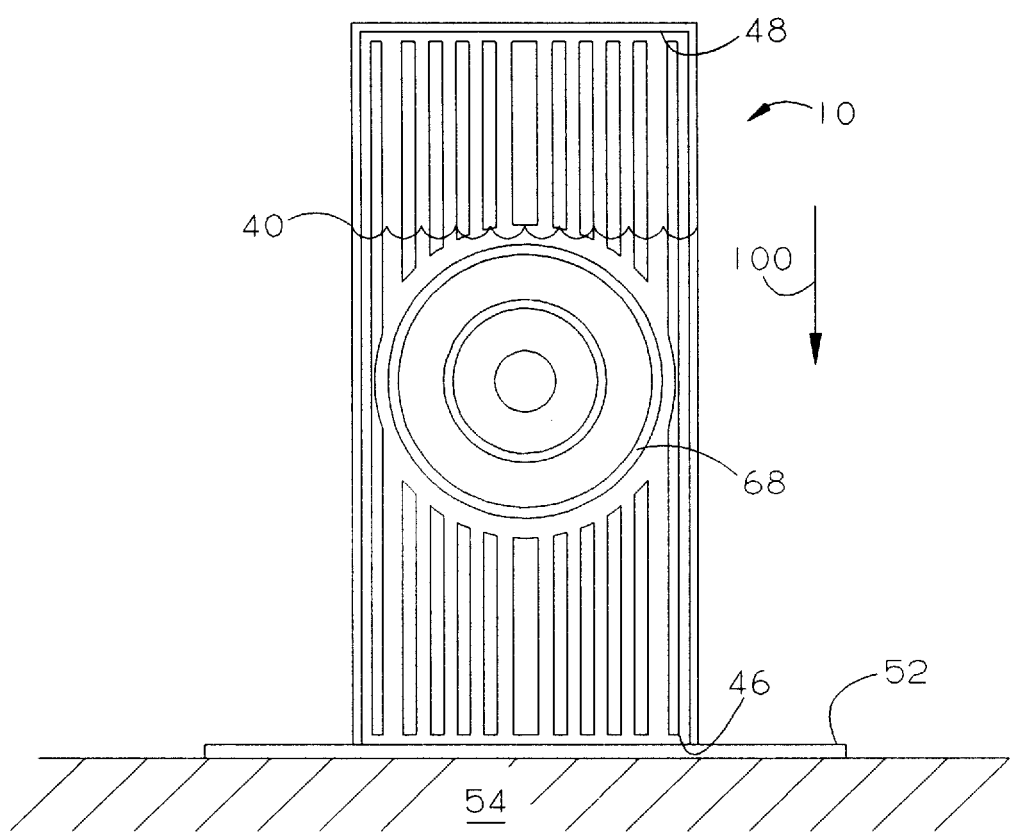
FIG. 4 is a schematic representation of the actuator of FIG. 3 when operated in an inverted position.

As illustrated in FIG. 4, when the actuator motor 10 of the exemplary embodiment is operated in an inverted position, operation is similar to that described above for an upright position except that heat will be rejected primarily by the second condenser 48 rather than the first condenser 46. Although the movement of vapor bubbles through the bubble channel 60 will pump the two-phase fluid upward due to percolation effect, it is preferable that the boiling chamber 36 be filled with a sufficient amount of two-phase fluid 38 such that in either an upright or an inverted position the liquid level 40 is above the stator 18 such that the liquid constituent of the two-phase fluid 38 will completely surround the thermally conductive wall 68 of the housing 30, to provide even heat transfer to the boiling fluid and preclude the possibility of hot spots developing in the winding 22. In the exemplary embodiment of the actuator motor 10 as depicted in FIG. 4, the second condenser 48 transfers heat directly to ambient air surrounding the actuator motor 10 rather than into the airframe 54 as does the first condenser 46. Those skilled in the art will readily recognize, however, that the second condenser 48 could also be attached directly to the airframe or other heat sink means 54 depending upon the particular application.

Figure 5:
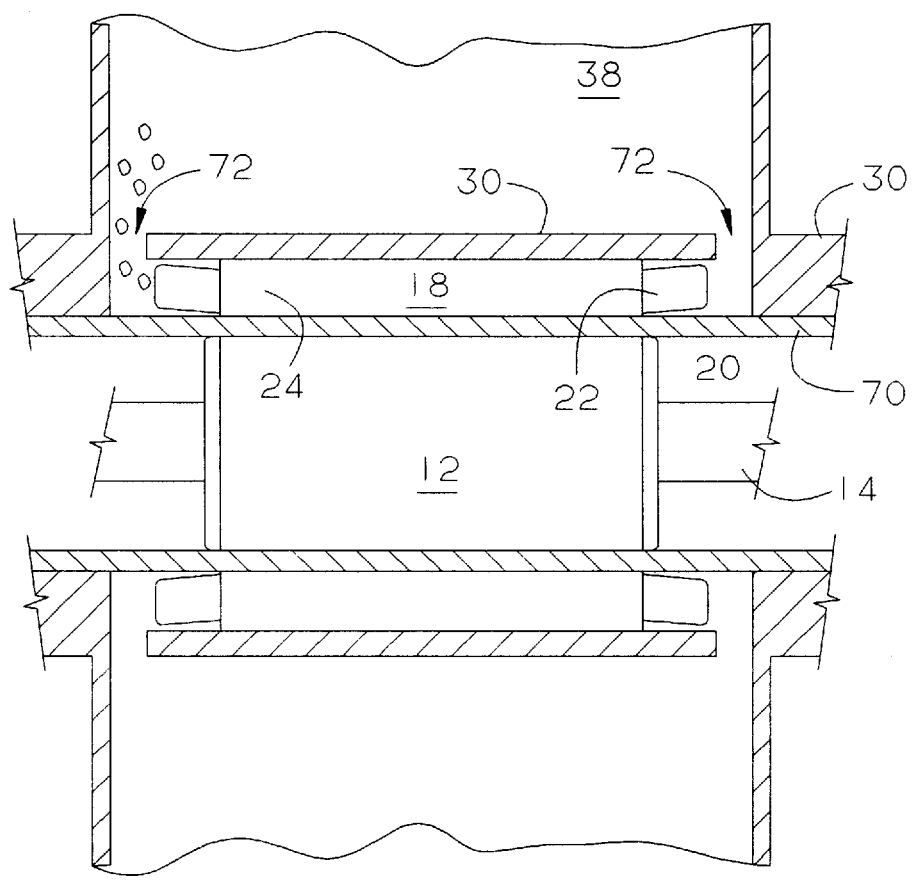
FIG. 5 is an alternate embodiment of the actuator motor illustrated in FIG. 1, in which the refrigerant fluid of the reflux cooler is allowed to directly contact a winding and a core of a motor stator, but is prevented by a sleeve from entering an airgap or contacting the rotor of the actuator motor.

FIG. 5 illustrates an alternate embodiment of our invention in which a nonmagnetic, fluid-impermeable sleeve 70 is pressed into the housing 30 following installation of the stator 18, and the housing 30 is provided with passages 72 such that the two-phase fluid 38 in the boiling chamber 36 may directly contact the electrical winding 22 and the core 24 of the stator, but leakage of the two-phase fluid 38 into the airgap 20 or contact with the rotor 12 is prevented. Such an embodiment allows for enhanced cooling of the core 24 and winding 22 while still obviating the need for fluid seals around the output shaft 16 of the actuator motor 10.

Figure 6:
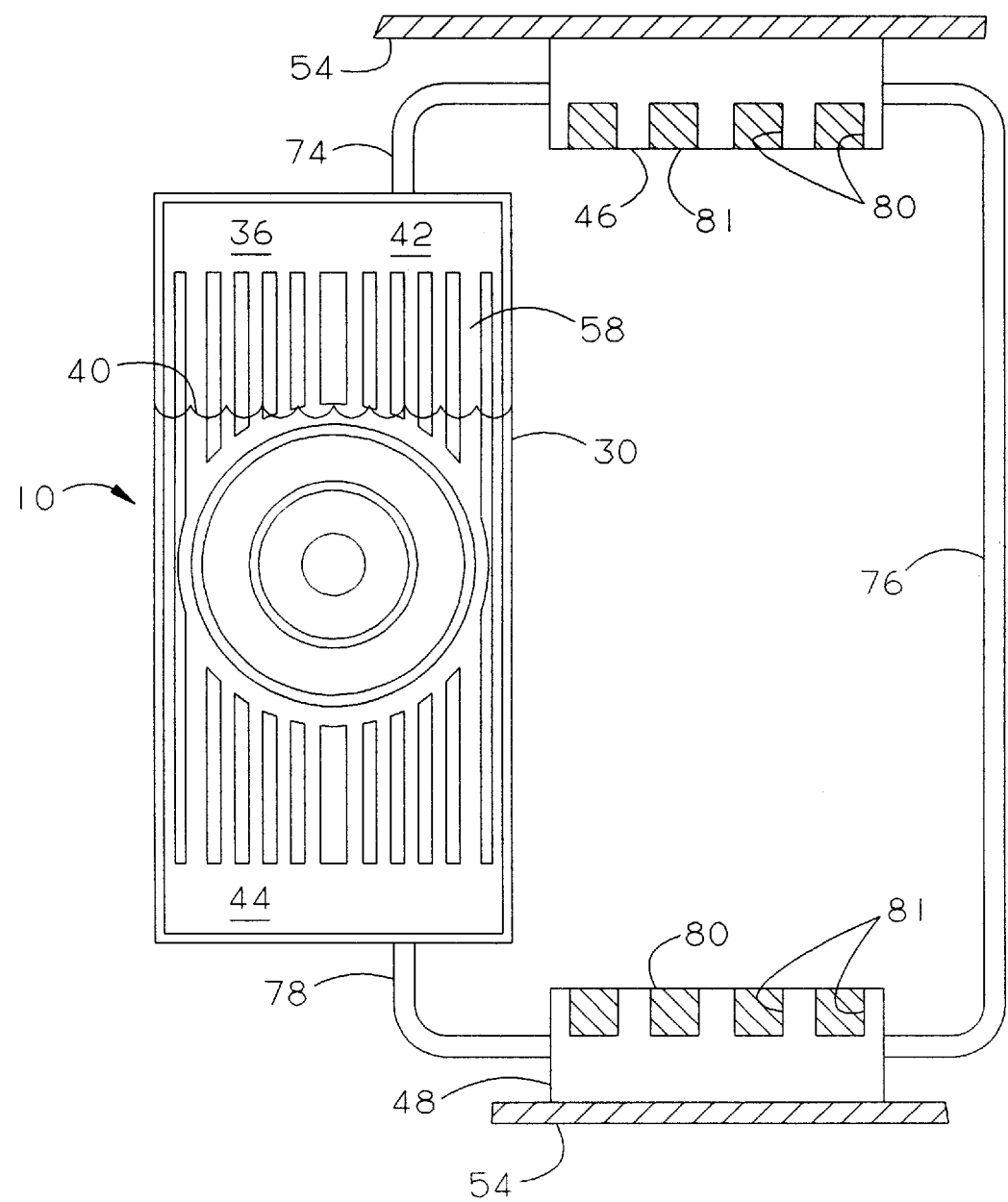
FIG. 6 illustrates an alternate embodiment of the actuator motor of FIG. 1 in which condensers of the reflux cooler are mounted remotely from the actuator housing.

FIG. 6 depicts an alternate embodiment of our invention wherein the first and second condensers 46,48 are mounted remotely from the housing 30 of the actuator motor 10 in order to facilitate installation into a particular application. A first conduit 74 connects the upper end of the boiling chamber 36 of the housing to the first condenser 46, and a second conduit 78 connects the lower portion of the boiling chamber 36 to the second condenser 48. A third conduit 76 provides fluid connection between the first and second condensers 46,48. In a normal upright orientation, the vapor constituent of the two-phase fluid will flow from the boiling chamber 36 through the first conduit 74 to the first condenser 46 where it will condense and then return to the boiling chamber 36 via the third conduit 76, the second condenser 48 and the second conduit 78. When the actuator motor 10 is operated in an inverted position, the vapor constituent of the two-phase fluid 38 will travel to the second condenser 48 via the second conduit 78 where it will be condensed and then return to the boiling chamber 36 via the third conduit 76, the first condenser 46, and the first conduit 74. Where necessary, the first, second and third conduits 74,78,76 may be provided by flexible lines such that the housing 30 may be articulated with respect to the first and second condensers 46,48. As illustrated in FIG. 6, additional PCM material 80 may be incorporated into sealed channels 81 in the first and/or second condenser 46,48 of any embodiment of our invention, in order to allow the actuator motor 10 to operate for a longer period of time during a transient above normal heat flux condition.

From the foregoing description, those skilled in the art will readily recognize that the reflux cooled electrical device of our invention overcomes problems encountered in prior electrical devices requiring individual localized cooling, and in particular, in an electro-mechanical device having a movable input/output shaft for connection to a mechanism external to the electro-mechanical device. The reflux cooling system of our invention is virtually maintenance free, and does not require regular recharging to replace coolant exhausted to the atmosphere during operation of the cooling system as did some prior cooling systems for electrical devices. Furthermore, our invention allows liquid refrigerant in the reflux cooler to directly contact a heat producing element such as a winding or an electromagnetic core of the electrical device and yet precludes leakage of the refrigerant into an airgap or contact with a second movable or stationary element of the electrical device. The need for providing a refrigerant seal about either a movable element of the electrical device or an input/output shaft is thereby precluded. Our invention is readily adaptable for use in an actuator motor of the flight control system of an aircraft wherein heat sinking for the reflux cooling system is provided by the airframe of the aircraft. Incorporation of the PCM material allows the reflux cooling system to be made smaller than it would otherwise would have to be by taking advantage of the duty cycle of the actuator. Because the reflux cooling system of our invention requires no pumps, valves, accumulators, etc. an electrical device with an integral cooler according to our invention can be readily manufactured in a compact, lightweight form, at low cost.

Those skilled in the art will further recognize that although we have described our invention herein with respect to certain specific embodiments and applications thereof, many other embodiments and applications of our invention are possible within the scope of our invention as described in the appended claims. For instance, although we have made numerous references herein to applications of our invention for actuators mounted in aircraft, our invention is by no means limited to use only in airborne applications. Our invention may be utilized with equal efficacy in other vehicular, marine, or stationary applications. A greater or lesser number of condensers may be utilized in other applications depending upon the importance of operation in orientations other than upright or inverted. The reflux cooling portion of our invention, including the boiling chamber 36, the fluid 38 and condenser 46 or 48, may be used without the PCM material 66 or the heat exchanger means 58. The axis 14 of motion of a movable element need not be perpendicular to the force of gravity. The element including the heat producing means which is cooled by the reflux cooler of our invention need not be disposed outward from a second element as depicted in the embodiments herein but may rather be disposed inwardly of the element which is not cooled.

Figure 7:
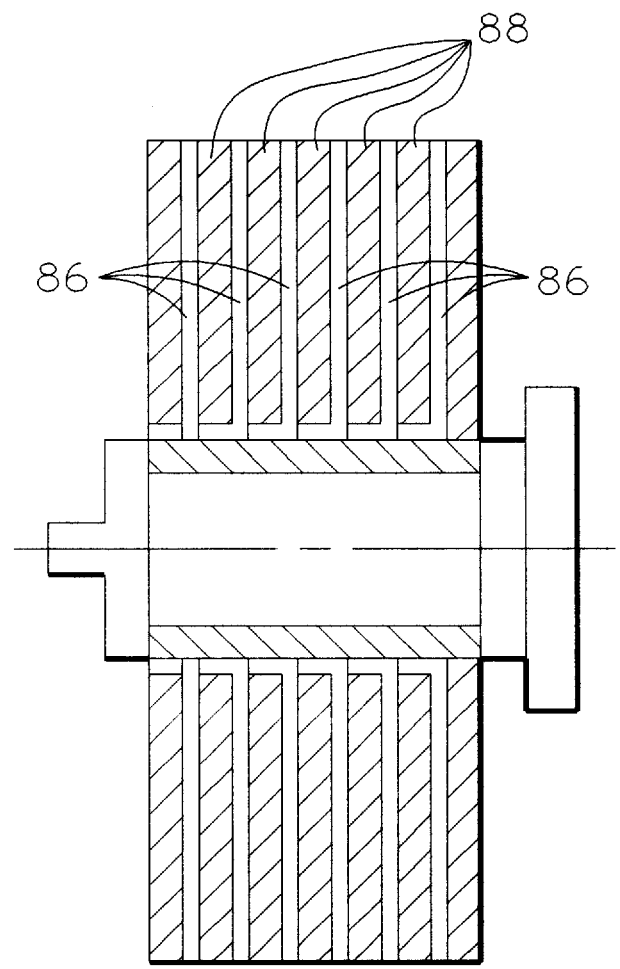
FIG. 7 is an alternate embodiment of the actuator motor of FIG. 1 in which the reflux cooler and phase change material within the reflux cooling system are configured as individual separable layers of a heat exchanger in order to provide improved survivability of the reflux cooling system.
Figure 8:
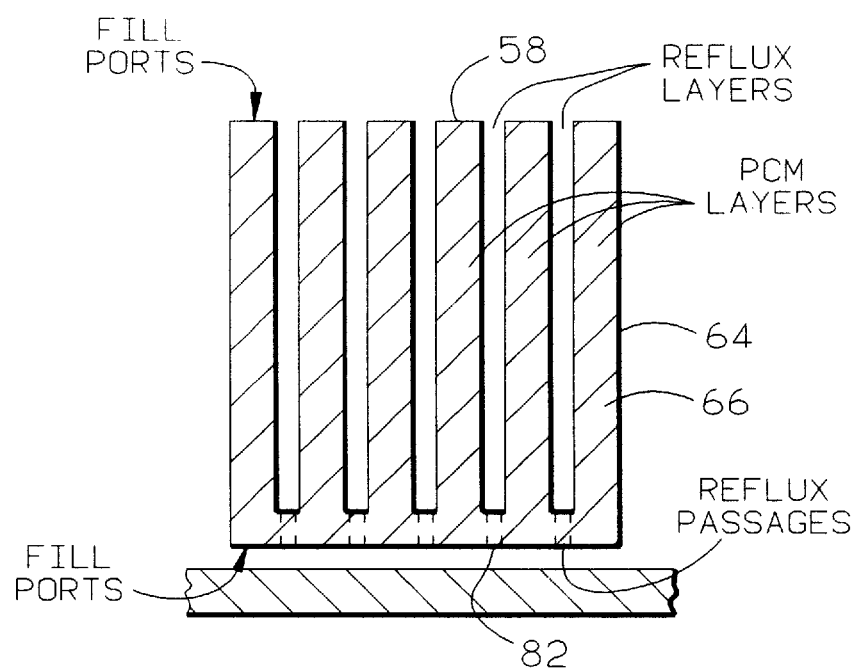
FIG. 8 illustrates an alternate embodiment of the actuator motor of FIG. 1 in which a plurality of layers of phase change material are joined by a common passage to facilitate installation of the phase change material into the reflux cooler.

The various components of our invention may be constructed by a variety of methods other than those specifically depicted herein. For instance, the housing 30 may be fabricated as an integral cast assembly, or by welding or brazing together two or more subassemblies. Other forms of joining together the subassemblies, such as by bolting with joints sealed by O-rings as illustrated specifically in FIG. 1, may also be utilized. As shown in FIG. 7, the reflux cooler and PCM layers of the heat exchanger and condenser of our invention may be fabricated as a series of individually sealed layers 86,88 rather than simply being immersed in a common boiling chamber 36 such that survivability of the reflux cooler will be improved in the event that one or more of the individual layers should be punctured or leak. In some applications of our invention it may prove beneficial to provide a common passage and fill port means 82 between the several sealed cavities 64 in heat exchanger 58 containing the PCM material 66, in order to facilitate installation of the PCM into the sealed chambers, and to provide an equalizing effect of the PCM throughout the heat exchanger 58, as illustrated in FIG. 8.

Figure 9A:
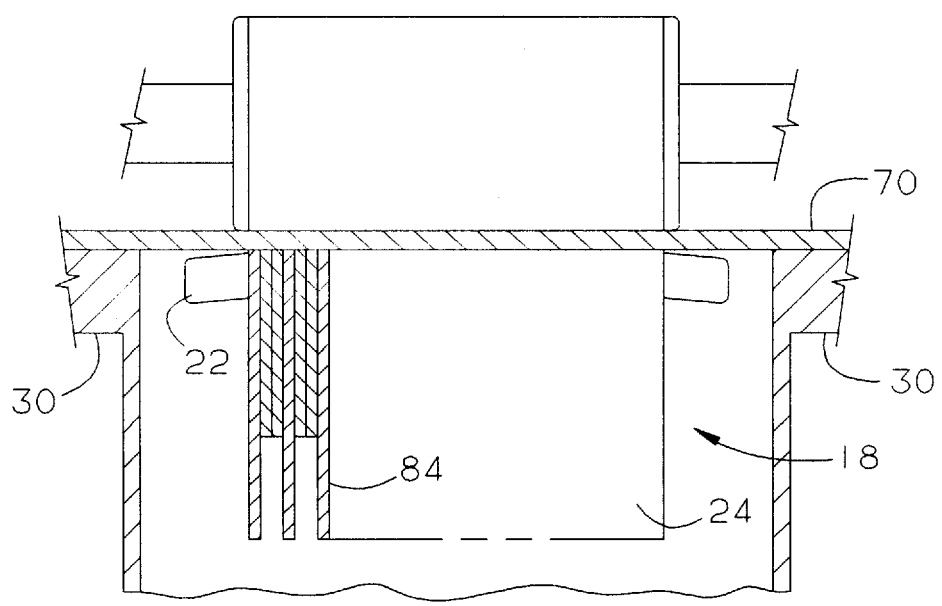
FIGS. 9a and 9b illustrate alternate embodiments of the actuator cooler of FIG. 1 in which the refrigerant is allowed to directly contact a laminated core of the actuator motor, and individual laminations of the stator core are extended outward into the liquid refrigerant for enhanced cooling.
Figure 9B:
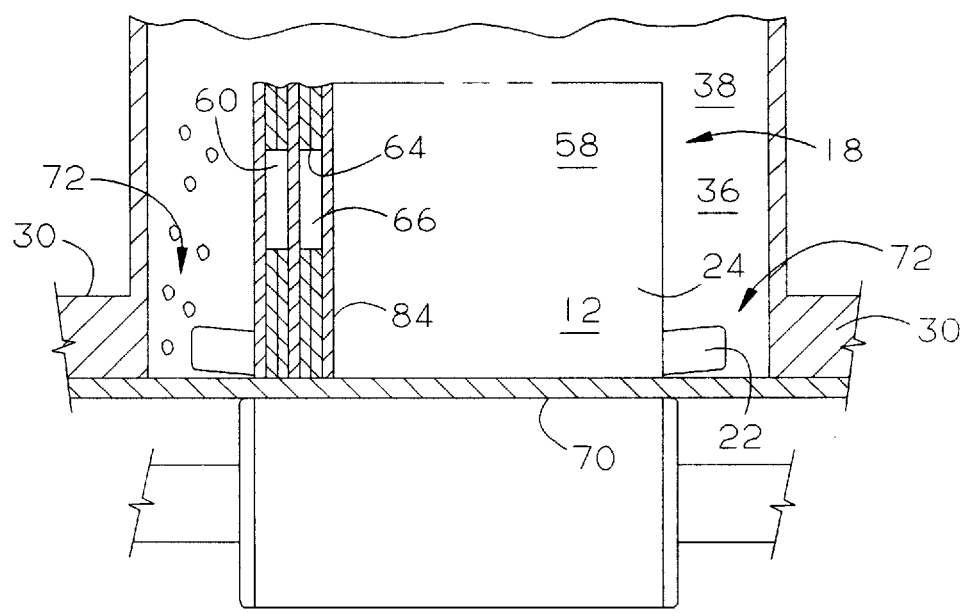

As shown in FIG. 9a, where the boiling chamber 36 of the housing 30 is configured to allow the refrigerant 38 to directly contact the winding 22 and core 24 of the stator 18, and where the stator 18 includes a laminated core 24 formed by individual laminations 84 bonded together along faying surfaces thereof, the individual laminations 84 may be extended out into the two-phase fluid to improve heat transfer from the laminated core 24. Alternatively, as depicted in FIG. 9b, the individual laminations 84 may be utilized to form the heat exchanger 58 and define the bubble channels 60 and the sealed chambers 64 for receipt of the PCM material.

Figure 1A:
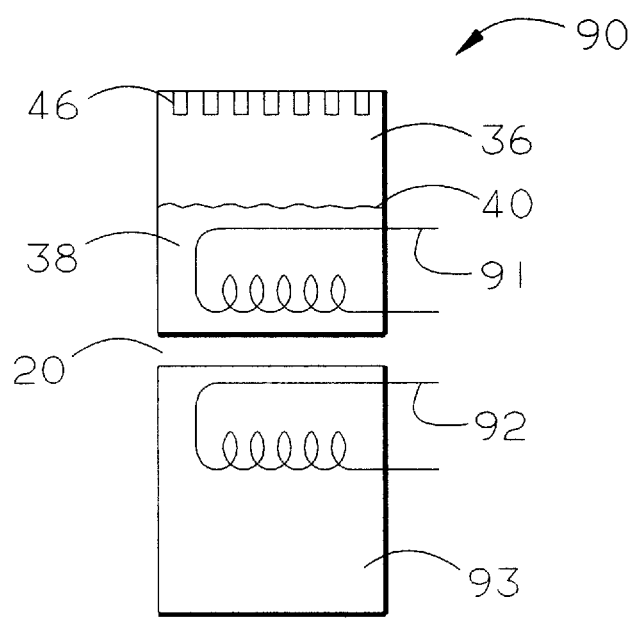
FIG. 1a is a schematic cross-sectional view of a transformer having an integral reflux cooler according to our invention.

As shown in FIG. 1a, our invention is also applicable to electrical devices such as a transformer 90 in which it is desirable to have the two-phase refrigerant 38 directly contact a first non-movable, heat-producing, element, such as winding 91, while preventing leakage of the refrigerant 38 into an airgap 20, or direct contact of the refrigerant 38 with a second non-movable element, such as winding 92, or a second cooling fluid 93 about the winding 92.

It is understood, therefore, that the spirit and scope of the appended claims should not be limited to the specific embodiments described and depicted herein.

We claim:

1. An electro-mechanical device comprising:
   a) a movable element mounted for motion with respect to an axis and having an axially extending output shaft adapted for attachment to a driven load;
   b) a stationary stator element disposed about said movable element but separated therefrom by an airgap, and having an electrical winding configured to exert an electromagnetic force for urging said movable element to move with respect to said axis when said winding is supplied with an electrical current;
   c) a housing disposed about and supporting said stator, and allowing said output shaft of said movable element to extend outside of said housing for attachment to said driven load;

d) said housing further defining a sealed boiling chamber about said stator for containing a two-phase fluid;

e) a two-phase fluid partially filling said boiling chamber and forming a liquid level defining a vapor space at an upper portion of said boiling chamber for containing a vapor constituent of said two-phase fluid, and a liquid space at a lower portion of said boiling chamber for containing a liquid constituent of said two-phase fluid;

f) a condenser adapted for attachment in thermal contact with a heat sink;

g) vapor conducting means for conducting the vapor constituent of said two-phase fluid from said boiling chamber to said condenser;

h) downcomer means for conducting a condensed constituent of said two-phase fluid from said condenser back to said boiling chamber; and i) phase change material disposed in said boiling chamber for providing cooling of said two-phase fluid through latent heat absorption of the phase change material above a predetermined melting temperature of said phase change material.

2. The electro-mechanical device of claim 1 wherein said condenser is mounted remotely from said housing and said vapor conducting and conduit means include conduit means for conducting said vapor and condensed constituents between said boiling chamber and said condenser.

3. The electro-mechanical device of claim 2 wherein said conduit means are flexible whereby said housing may be articulated with respect to said condenser.

4. The electro-mechanical device of claim 1 wherein said housing and stationary member are configured to allow said two-phase fluid to directly contact said winding.

5. The electro-mechanical device of claim 4 wherein said stator includes slots adjacent and opening toward said airgap for receipt of said winding, and said stator further includes an impervious sleeve pressed into said stator and said housing, following insertion of said winding, in such a manner to seal said slots and said boiling chamber with respect to said airgap and thus prevent leakage of fluid into said airgap from said boiling chamber or through said slots.

6. The electro-mechanical device of claim 1 wherein said movable element is rotatable about said axis for providing output torque via said output shaft when said electrical winding is supplied with said electrical current.

7. The electro-mechanical device of claim 1 wherein said movable element is translatable along said axis for providing linear force via said output shaft when said electrical winding is supplied with said electrical current.

8. An electro-mechanical device comprising;

a) a movable element mounted for motion with respect to an axis and having an axially extending output shaft adapted for attachment to a driven load;

b) a stationary stator element disposed about said movable element but separated therefrom by an airgap, and having an electrical winding configured to exert an electromagnetic force for urging said movable element to move with respect to said axis when said winding is supplied with an electrical current;

c) a housing disposed about and supporting said stator, and allowing said output shaft of said movable element to extend outside of said housing for attachment of said driven load;

d) said housing further defining a sealed boiling chamber about said stator for containing a two-phase fluid;

e) a two-phase fluid partially filling said boiling chamber and forming a liquid level defining a vapor space at an upper portion of said boiling chamber for containing a vapor constituent of said two-phase fluid, and a liquid space at a lower portion of said boiling chamber for containing a liquid constituent of said two-phase fluid;

f) a condenser adapted for attachment in thermal contact with a heat sink;

g) vapor conducting means for conducting the vapor constituent of said two-phase fluid from said boiling chamber to said condenser;

h) downcomer means for conducting a condensed constituent of said two-phase fluid from said condenser back to said boiling chamber;

i) a phase change material disposed in said boiling chamber for providing cooling of said two-phase fluid through latent heat absorption of the phase change material above a predetermined melting temperature of said phase change material; and j) heat exchanger means disposed in said boiling chamber, said heat exchanger means comprising:

a heat exchanger structure of thermally conductive material having:

a) bubble channels therein for directing a flow of vapor bubbles of the two-phase fluid in an upward direction from the liquid space to the vapor space of the boiling chamber;

b) downcomer channels which function as part of said downcomer means to conduct said condensed constituent of said two-phase fluid from said condenser to said liquid space of said boiling chamber; and c) a sealed cavity for containment therein of said phase change material.

9. The electro-mechanical device of claim 8 wherein said heat exchanger includes a plurality of said sealed cavities each individually sealing a portion of said phase change material therein in such a manner that if sealing integrity one of said plurality of sealed cavities is breached the PCM in the remaining sealed cavities remains sealed therein.

10. The electro-mechanical device of claim 8 wherein said heat exchanger includes a plurality of said sealed chambers interconnected in fluid communication by a sealed PCM passage which provides means for a flow of PCM from one sealed chamber to another, thereby equalizing the effect of the PCM throughout the heat exchanger and also facilitating installation of the PCM into the sealed chambers by providing a common fill port means.

11. The electro-mechanical device of claim 8 wherein said stator includes a laminated core formed by individual laminations bonded together along faying surfaces thereof; and wherein said heat exchanger is formed by portions of said individual laminations that extend outward from said stationary element into said boiling chamber of said housing.

12. An electro-mechanical device comprising:

a) a movable element mounted for motion with respect to an axis and having an axially extending output shaft adapted for attachment to a driven load;

b) a stationary stator element disposed about said movable element but separated therefrom by an airgap, and having an electrical winding configured to exert an electromagnetic force for urging said movable element to move with respect to said axis when said winding is supplied with an electrical current;

c) a housing disposed about and supporting said stator, and allowing said output shaft of said movable element to extend outside of said housing for attachment to said driven load;

d) said housing further defining a sealed boiling chamber about said stator for containing a two-phase fluid;

e) a two-phase fluid partially filling said boiling chamber and forming a liquid level defining a vapor space at an upper portion of said boiling chamber for containing a constituent of said two-phase fluid, and a liquid space at a lower portion of said boiling chamber for containing a liquid constituent of said two-phase fluid;

f) a condenser adapted for attachment in thermal contact with a heat sink, said condenser forming an upper surface of said housing and including heat exchanging fin means extending into said vapor space of said boiling chamber;

g) vapor conducting means for conducting the vapor constituent of said two-phase fluid from said boiling chamber to said condenser; and h) downcomer means for conducting a condensed constituent of said two-phase fluid from said condenser back to said boiling chamber.

13. An electro-mechanical device comprising:

a) a movable element mounted for motion with respect to an axis and having an axially extending output shaft adapted for attachment to a driven load;

b) a stationary stator element disposed about said movable element but separated therefrom by an airgap, and having an electrical winding configured to exert an electromagnetic force for urging said movable element to move with respect to said axis when said winding is supplied with an electrical current;

c) a housing disposed about and supporting said stator, and allowing said output shaft of said movable element to extend outside of said housing for attachment to said driven load;

d) said housing further defining a sealed boiling chamber about said stator for containing a two-phase fluid;

e) a two-phase fluid partially filling said boiling chamber and forming a liquid level defining a vapor space at an upper portion of said boiling chamber for containing a vapor constituent of said two-phase fluid, and a liquid space at a lower portion of said boiling chamber for containing a liquid constituent of said two-phase fluid;

f) a condenser adapted for attachment in thermal contact with a heat sink;

g) vapor conducting means for conducting the vapor constituent of said two-phase fluid from said boiling chamber to said condenser; and h) downcomer means for conducting a condensed constituent of said two-phase fluid from said condenser back to said boiling chamber; and i) a second condenser adapted for attachment in thermal contact with a heat sink disposed below said boiling chamber and connected via second vapor conducting means and second downcomer means to said liquid space of said boiling chamber whereby when said electro-mechanical device is operated in other than an upright position said second condenser will receive said vapor constituent of said two-phase fluid from said boiling chamber via said second vapor conducting means and return said condensed fluid constituent of said two-phase fluid via said second downcomer means to said boiling chamber.

14. The electro-mechanical device of claim 13 wherein said second condenser forms a lower surface of said housing and includes heat exchange means extending into said liquid space of said boiling chamber.

15. The electro-mechanical device of claim 13 wherein said second condenser is mounted remotely from said housing and said vapor conducting and conduit means include conduit means for conducting said vapor and condensed constituents between said boiling chamber and said second condenser.

16. The electro-mechanical device of claim 15 wherein said conduit means are flexible whereby said housing may be articulated with respect to said second condenser.

17. An electro-mechanical device comprising:

a) a movable element mounted for motion with respect to an axis and having an axially extending input shaft adapted for attachment to a drive source;

b) a stationary stator element disposed about said movable element but separated therefrom by an airgap, and having an electrical winding configured to produce an electrical current when said movable element is moved with respect to said axis;

c) a housing disposed about and supporting said stator, and allowing said input shaft of said movable element to extend outside of said housing for attachment to said drive source;

d) said housing further defining a sealed boiling chamber about said stator for containing a two-phase fluid;

e) a two-phase fluid partially filling said boiling chamber and forming a liquid level defining a vapor space at an upper portion of said boiling chamber for containing a vapor constituent of said two-phase fluid, and a liquid constituent of said two-phase fluid;

f) a condenser adapted for attachment in thermal contact with a heat sink;

g) vapor conducting means for conducting the vapor constituent of said two-phase fluid from said boiling chamber to said condenser;

h) downcomer means for conducting a condensed constituent of said two-phase fluid from said condenser back to said boiling chamber; and i) a phase change material disposed in said boiling chamber for providing cooling of said two-phase fluid through latent heat absorption of the phase change material above a predetermined melting temperature of said phase change material.

18. The electro-mechanical device of claim 17 wherein said movable element is rotatable about said axis when provided with a rotary torque input from said drive source.

19. An electro-mechanical device comprising:

a) a stationary member including a heat-producing element;

b) a movable element disposed adjacent to said stationary element and operably coupled by magnetic force thereto;

c) cooling means having a sealed refrigerant chamber disposed to allow a two-phase refrigerant contained therein to directly contact said heat producing element but not to directly contact said movable element; and d) a phase change material disposed in said sealed refrigerant chamber for providing cooling of said two-phase refrigerant through latent heat absorption of the phase change material above a predetermined melting temperature of said phase change material.

20. The electro-mechanical device of claim 19 wherein said heat-producing element is an electrical winding.

21. The electro-mechanical device of claim 19 wherein said heat-producing element is a magnetic core.

22. In an electrical device having a first and second element separated by an airgap and operably connected by electromagnetic forces extending across said airgap:

a) heat-producing means in at least one of said first or second elements;

b) cooling means including a two-phase refrigerant in direct contact with said heat-producing means, but not allowing said refrigerant to enter said airgap; and c) a phase change material included in said cooling means for providing cooling of said two-phase refrigerant through latent heat absorption of the phase change material above a predetermined melting temperature of said phase change material.

23. The electrical device of claim 22 wherein at least one of said first or second elements is movable with respect to the other.

* * * * *